US006555445B2

United States Patent
Hayashi et al.

(10) Patent No.: US 6,555,445 B2
(45) Date of Patent: Apr. 29, 2003

(54) MANUFACTURING METHOD OF SEMICONDUCTOR DEVICE (75) Inventors: Tetsuya Hayashi, Tokyo (JP); Toshifumi Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/121,542

(22) Filed: Apr. 12, 2002

(65) Prior Publication Data

US 2002/0160594 A1 Oct. 31, 2002

(30) Foreign Application Priority Data

Apr. 25, 2001 (JP) ......... 2001-127528

(51) Int. Cl.[7] .......... H01L 21/30; H01L 21/46; H01L 21/31; H01L 21/336; H01L 21/78
(52) U.S. Cl. .......... 438/458; 438/460; 438/758; 438/928; 438/301
(58) Field of Search .......... 438/301, 439, 438/458, 460, 586, 702, 758, 928

(56) References Cited

U.S. PATENT DOCUMENTS

| 5,362,683 A | * | 11/1994 | Takenaka et al. ......... 438/458 |
| 5,498,570 A | * | 3/1996 | Becker ......... 438/586 |
| 5,633,209 A | * | 5/1997 | Leedy ......... 438/702 |
| 5,856,230 A | * | 1/1999 | Jang ......... 438/439 |
| 6,013,564 A | * | 1/2000 | Muramatsu ......... 438/460 |
| 6,153,536 A | * | 11/2000 | Brouillette et al. ......... 438/758 |
| 6,162,730 A | * | 12/2000 | Kai et al. ......... 438/928 |
| 6,413,436 B1 | * | 7/2002 | Aegerter et al. ......... 438/928 |

FOREIGN PATENT DOCUMENTS

JP 09-266192 10/1997

* cited by examiner

Primary Examiner—John F. Niebling
Assistant Examiner—Walter L. Lindsay, Jr.
(74) Attorney, Agent, or Firm—Katten Muchin Zavis Rosenman (57) ABSTRACT In order to suppress generation of waste matter which results from removing a backside film formed by growing a film on both surfaces of a semiconductor substrate and thereby attain satisfactorily high yield and productivity, on a semiconductor substrate 301, a polycrystalline silicon film 303 is formed through double-sided growth, and only on the obverse surface of the semiconductor substrate 301 a silicide film 304 is formed thereon, and then those polycrystalline silicon film 303 and silicide film 304 are worked into shape to form gate electrodes 303a. After that, on the semiconductor substrate 301, an insulating film for sidewall formation is formed to cover the gate electrodes 303a through double-sided growth, and the insulating film for sidewall formation formed on the obverse surface of the semiconductor substrate 301 is etched to form sidewall films. Only on the obverse surface side of the semiconductor substrate 301, an interlayer insulating film is formed to cover the gate electrodes 303a, and thereafter the polycrystalline silicon film 303 and the insulating film for sidewall formation, both of which are formed on the reverse surface side of the semiconductor substrate 301, as well as a part of said semiconductor substrate 301 in depth from the reverse surface are removed by grinding, whereby a semiconductor device is fabricated.

9 Claims, 9 Drawing Sheets

MANUFACTURING METHOD OF SEMICONDUCTOR DEVICE

BACKGROUND OF THE INVENTION

The present invention relates to a manufacturing method of a semiconductor device and more particularly to a backside film which is formed by growing a film on both surface sides of a semiconductor substrate.

When a thin film is formed on a semiconductor substrate, the film is grown on either both of the obverse surface and the reverse surface of the semiconductor substrate (double-sided growth) or only the obverse surface thereof (single-sided growth), depending on the method of growing a film, the flow of the steps in the manufacturing method, the apparatus used therein and so forth.

For example, in the case that a polycrystalline silicon film to fabricate a gate electrode or the like, an insulating film to form a sidewall film, an interlayer insulating film or such is to be formed, as the film is generally grown by the LP-CVD (Low Pressure-Chemical Vapour Deposition) method, the deposition of the film proceeds not only on the obverse surface side of the semiconductor substrate but also on the reverse surface side thereof.

The backside film of this sort is, subsequently, removed by the following reasons.

Firstly, when another film is to be formed by the CVD method following formation of the foregoing film, the semiconductor substrate may not be able to be fixed onto a CVD apparatus satisfactorily, unless the backside film is removed. Secondly, in transporting the semiconductor substrate in the steps of a manufacturing method, the presence of any backside film may prevent the semiconductor substrate from attaching onto a transportation vehicle sufficiently. Thirdly, in the step of performing photolithography, if any backside film is left behind, focus at exposure may shift.

For the above reasons, when a thin film is grown on both surface sides of a semiconductor substrate in the conventional manufacturing method, the step of removing the backside film is performed before proceeding other steps. The semiconductor substrate is formed into a prescribed thickness by grinding from the reverse surface, after all other steps are completed.

However, in the methods of manufacturing a semiconductor device wherein a thin film is formed through double-sided growth and its backside film part is then removed, there are occasions in which waste matter and dust are generated in the steps subsequent to the step of the removal.

Figure 4:
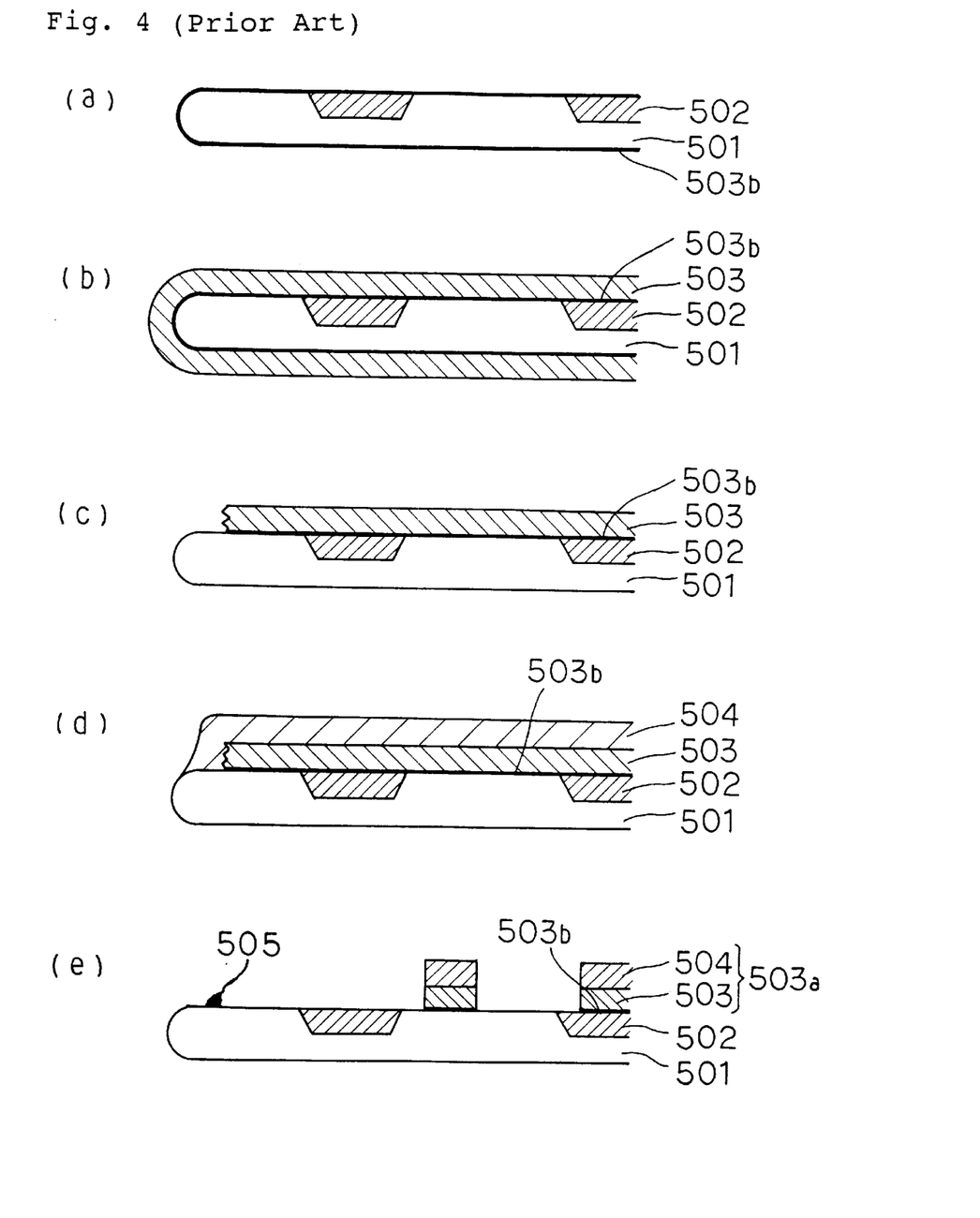
FIG. 4 is a series of schematic cross-sectional views illustrating the steps of a conventional manufacturing method of a semiconductor device.

For instance, as shown in FIG. 4(a), after element isolation regions 502 are formed on a semiconductor substrate 501, a gate oxide film 503b is grown. Following that, as shown in FIG. 4(b), a polycrystalline silicon film 503 to fabricate gate electrodes is formed into a thickness of 200 nm or so. As the LP-CVD method is generally employed for the forming method, the polycrystalline silicon film 503 is grown on both of the obverse surface side and the reverse surface side of the semiconductor substrate 501. Consequently, etching is performed to remove a part of the polycrystalline silicon film 503 formed on the reverse surface side of the semiconductor substrate 501 and thereby a structure shown in FIG. 4(c) is obtained. In this instance, a portion of the polycrystalline silicon film lying on the edge section on the obverse surface side of the semiconductor substrate 501 may be, in part, removed therewith. The gate oxide film 503b on the reverse surface side can be also removed hereat, if circumstances require.

After that, as shown in FIG. 4(d), a silicide film 504 with a thickness of 200 nm or so is formed only on the obverse surface side of the semiconductor substrate, using the sputtering method.

The polycrystalline silicon film 503 and the silicide film 504 fabricated as described above are then etched and worked into gate electrodes, as shown in FIG. 4(c). In some cases, however, that etching conducted to form gate electrodes leaves a residue 505 behind, as shown in FIG. 4(e), which causes generation of waste matter and dust.

Figure 5:
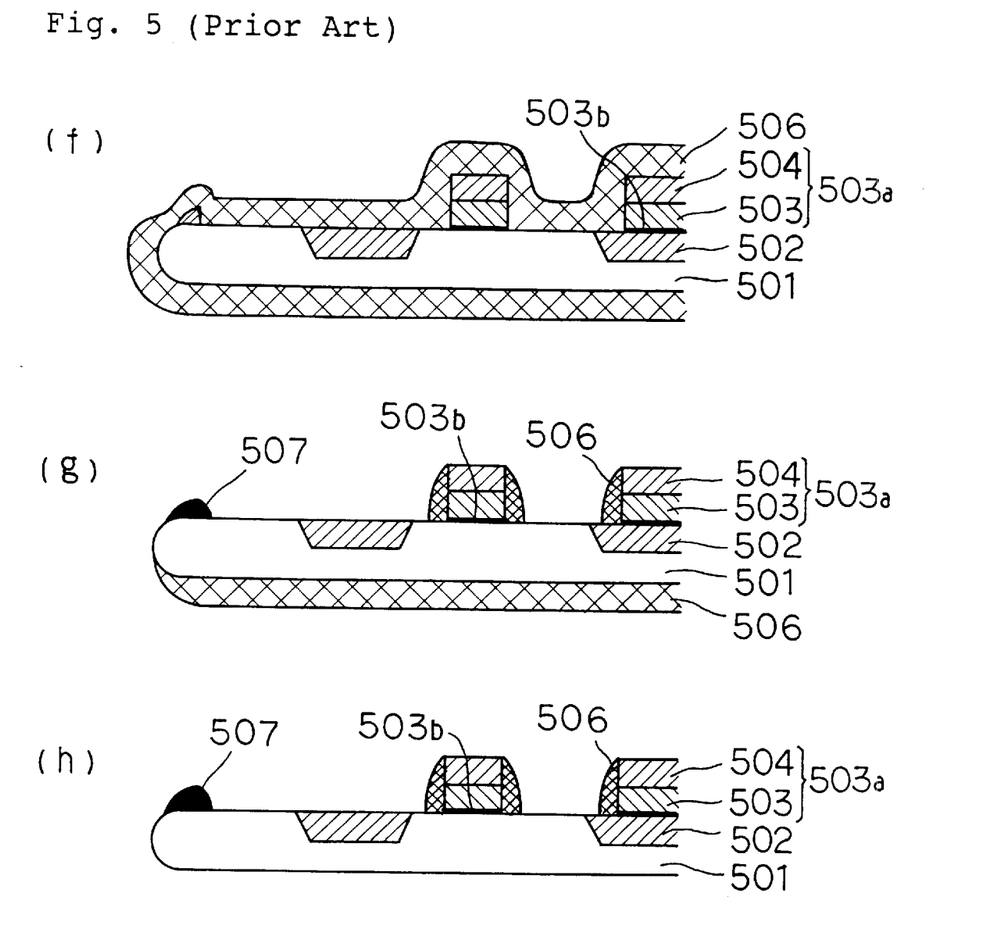
FIG. 5 is a series of schematic cross-sectional views illustrating further steps of: the conventional manufacturing method of a semiconductor device.

Further, after the gate electrodes are formed, for the purpose of forming sidewall films on the sidewalls of the gate electrodes, an insulating film 506 with a thickness of 250 nm or so is formed through double-sided growth by the LP-CVD method (FIG. 5(f)). Next, as shown in FIG. 5(g), the insulating film 506 lying on the side of the obverse surface is etched and sidewall films 506 are formed on the lateral faces of the gate electrodes 503a. After that, as shown in FIG. 5(h), the insulating film 506 formed on the side of the reverse surface of the semiconductor substrate is removed by means of etching, but, also on this occasion, a residue 507 may remain, as shown in FIG. 5(g), causing generation of waste matter and dust.

If waste matter and dust are generated, as described above, in the steps of manufacturing a semiconductor device, a sufficient yield may not be able to be attained, and besides an additional steps of etching to remove waste matter and dust may become necessary, which lowers productivity.

Further, because the step of removing the backside film is performed independently from the step of grinding the reverse surface of the semiconductor substrate finally, the manufacturing method may become unduly complicated and, in some cases, even satisfactory productivity cannot be achieved.

Further, in Japanese Patent Application Laid-open No. 266192/1997, there is disclosed a method wherein a film is formed on the obverse surface as well as the reverse surface of a wafer, and thereafter the foregoing film lying on the obverse surface of the foregoing wafer is subjected to etching, while the foregoing film lying on the reverse surface of the wafer is made to remain. Further, in the method described in that publication, as the steps of the method proceed, layers of polysilicon and other materials become overlaid on the reverse surface of the semiconductor substrate, and it is described therein that these layers are peeled off together after the step of the final heating treatment, namely, a high temperature treatment at 800° C.–850° C., which may exert thermal stress is completed.

Nevertheless, the main concern in that publication is thermal stress produced in the semiconductor substrate by the heat treatment when the semiconductor substrate has different numbers of films formed on the obverse surface and the reverse surface. Accordingly, this problem of thermal stress is solved by growing films equally on both of the obverse surface and the reverse surface and making qualities and thicknesses of these films on both surfaces identical, and nothing is mentioned therein to reduce the amount of waste matter and dust.

Moreover, although the films formed on the reverse surface of the semiconductor device are peeled off together after the heating steps are completed, grinding is not described to apply to the reverse surface of the semiconductor device. In effect, in a method of the publication, even after the backside films are peeled off, another film may be grown by a method without heat application, which may lead to formation of a backside film.

SUMMARY OF THE INVENTION

As set forth above, waste matter and dust brought about by removing the backside film which is formed through double-sided growth have not been hitherto regarded as a serious problem. Under such circumstances, the present inventors recognized waste matter and dust of this sort can be one of prime factors to lower yield and productivity in semiconductor device fabrication. Accordingly, an object of the present invention is to suppress generation of waste matter and attain satisfactory yield and productivity. Further, another object of the present invention is to achieve an improvement in productivity by performing the step of removing the backside film, concurrently with the step of grinding the reverse surface of the semiconductor substrate.

In light of the above problems, the present invention provides a method of manufacturing a semiconductor device, which comprises the steps of:

forming a first film on both of an obverse surface side and a reverse surface side of a semiconductor substrate; and removing, by means of grinding, said first film formed on the reverse surface side of said semiconductor substrate as well as a part of said semiconductor substrate in depth from the reverse surface.

More specifically, the present invention provides a method of manufacturing a semiconductor device; which comprises the steps of forming a polycrystalline silicon film into a thickness of not less than 50 nm but not greater than 150 nm on both of an obverse surface side and a reverse surface side of a semiconductor substrate;

forming, only on the obverse surface side of said semiconductor substrate, a silicide film into a thickness of not less than 50 nm but not greater than 200 nm over said polycrystalline silicon film;

working said polycrystalline silicon film and said silicide film into shape and thereby forming a gate electrode;

forming, on both of the obverse surface side and the reverse surface side of said semiconductor substrate, an insulating film for sidewall formation into a thickness of not less than 50 nm but not greater than 200 nm to cover said gate electrode;

etching said insulating film for sidewall formation which is formed on the obverse surface side of said semiconductor substrate and thereby forming a sidewall film on a lateral face of said gate electrode;

forming, only on the obverse surface side of said semiconductor substrate, an interlayer insulating film into a thickness of not less than 500 nm but not greater than 1.5 $\mu$m to cover said gate electrode; and removing, by means of grinding, said polycrystalline silicon film and said insulating film for sidewall formation, both of which are formed on the reverse surface side of said semiconductor substrate, as well as a part of said semiconductor substrate in depth from the reverse surface.

In the above manufacturing methods, any backside film formed through double-sided growth is not removed until fabrication of the obverse surface of the semiconductor substrate is completed, and, after completing the obverse surface fabrication, in the step of grinding the reverse surface of the semiconductor substrate, the backside films are also all removed by means of grinding. Further, as the method of growing a film, a method of single-sided growth, in other words, a method in which no film is allowed to grow on the reverse surface side of the semiconductor substrate, should be employed therein ,as long as circumstances permit. As a result, generation of waste matter can be well suppressed and satisfactory yield can be attained. Further, because it is unnecessary to perform any additional etching to remove waste matter, the manufacturing method becomes simplified and satisfactory productivity, provided. Furthermore, since the removal of the backside films is carried out along with final grinding of the reverse surface of the semiconductor substrate, the manufacturing method becomes simplified and productivity, enhanced.

In this manufacturing method of the present invention, any backside film formed through double-sided growth is not removed until fabrication of the obverse surface of the semiconductor substrate is completed, and, after completing the obverse surface fabrication, in the step of grinding the reverse surface, the backside films are removed together. As a result, even if the manufacturing method comprises the step of double-sided growth of a thin film, it can be avoided that a part of the film remains as waste matter on the wafer edge section while the obverse surface is fabricated, which facilitates to attain excellent yield and productivity.

DETAILED DESCRIPTION

For perfection of the present invention, the present inventors conducted various investigations and successfully found out the prime causes for generation of waste matter and dust. First, analysis of composition of waste matter and dust established that they originate from silicide films, insulating films and metal interconnection films of Al, Cu and such.

Next, in order to clarify in what a particular part of a wafer waste matter and dust are generated, semiconductor substrates from which backside films were removed in the midst of manufacturing steps were closely observed and it was revealed that waste matter is liable to attach onto the edge section of the wafer.

On the basis of the above analysis, waste matter and dust are considered to be generated in the following way. When a backside film formed through double-sided growth is removed, a portion of a film lying on the edge section on the obverse surface side is, in part, removed together to produce a stepped part, and, at that position, an etching residue is produced in the step of etching and peeled off from the wafer in the subsequent steps, generating waste matter and dust.

Figure 6:
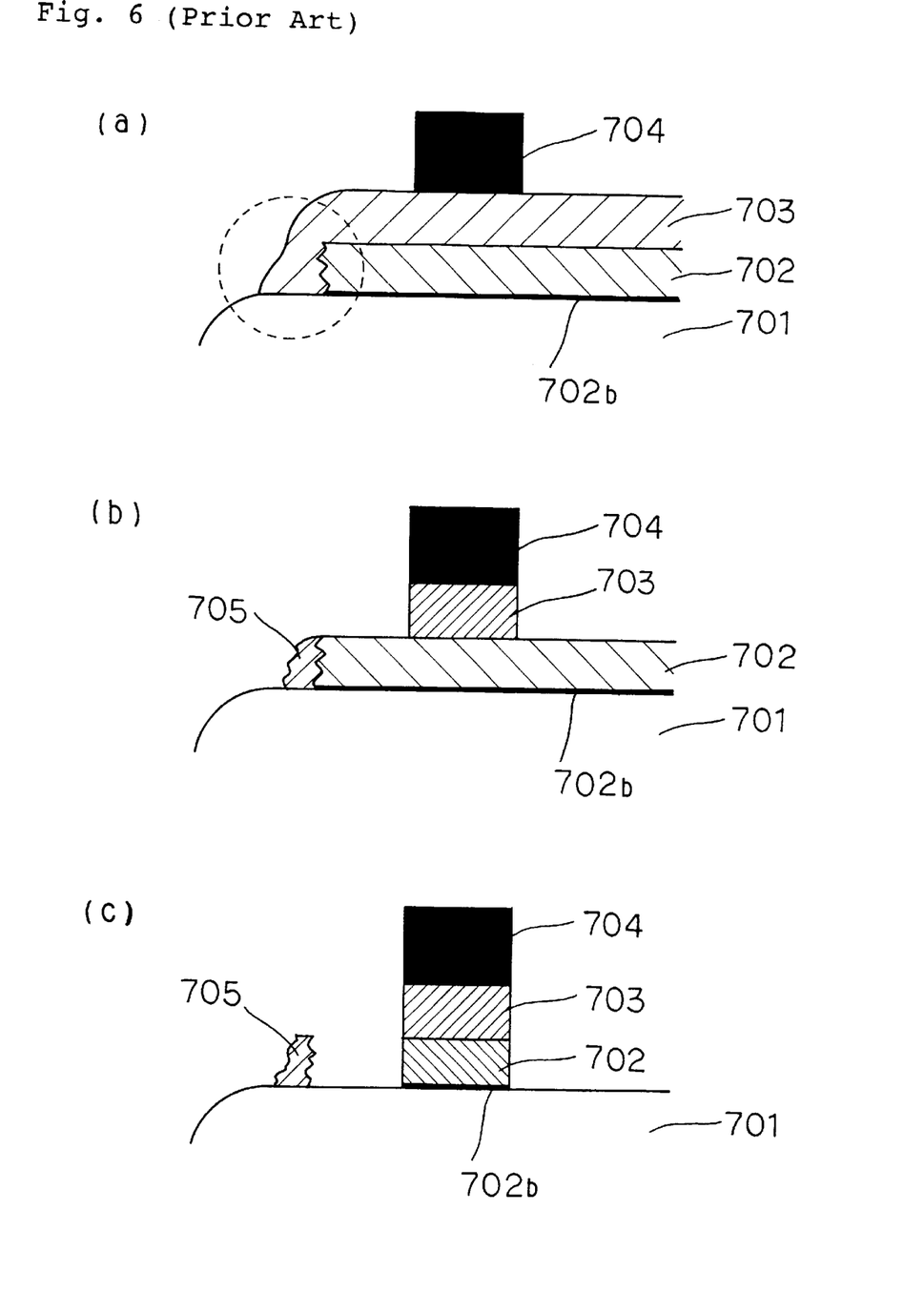
FIG. 6 is another series of schematic cross-sectional views illustrating the steps of the conventional manufacturing method of a semiconductor device.

Referring to FIG. 6, the above explanation is described in detail below. FIG. 6(a) is an enlarged view of a cross-section of a wafer edge section, showing a state wherein, after forming a gate oxide film 702b, a backside film within a polycrystalline silicon film 702 that is formed to fabricate a gate electrode is removed and a silicide film 703 is formed only on the obverse surface side (corresponding to FIG. 4(d)), and thereafter a photoresist 704 for patterning the gate electrode is disposed.

When the backside film within the polycrystalline silicon film formed through double-sided growth is removed, a portion of the polycrystalline silicon film 702 on the obverse surface side is, in part, peeled off on the edge section of the wafer, as shown encircled in FIG. 6(a). As a result, a stepped part having a sidewall is formed on the edge section of the polycrystalline silicon film.

When the silicide film 703 is etched in this state, the silicide film 703 cannot be etched sufficiently, owing to the presence of a sidewall on the edge section of the polycrystalline silicon film 702, and a remnant silicide 705 is generated, as shown in FIG. 6(b). When the polycrystalline silicon film 702 is subsequently etched, the remnant silicide 705 may not be removed and left behind, even after completion of etching, as shown in FIG. 6(c).

The remnant silicide 705 which is formed as described above becomes waste matter and dust, when it is peeled off from the semiconductor substrate 701 in the subsequent steps. Furthermore, even if the remnant silicide 705 is not peeled off therefrom, waste matter and dust may be generated through a mechanism shown in FIG. 7.

Figure 7:
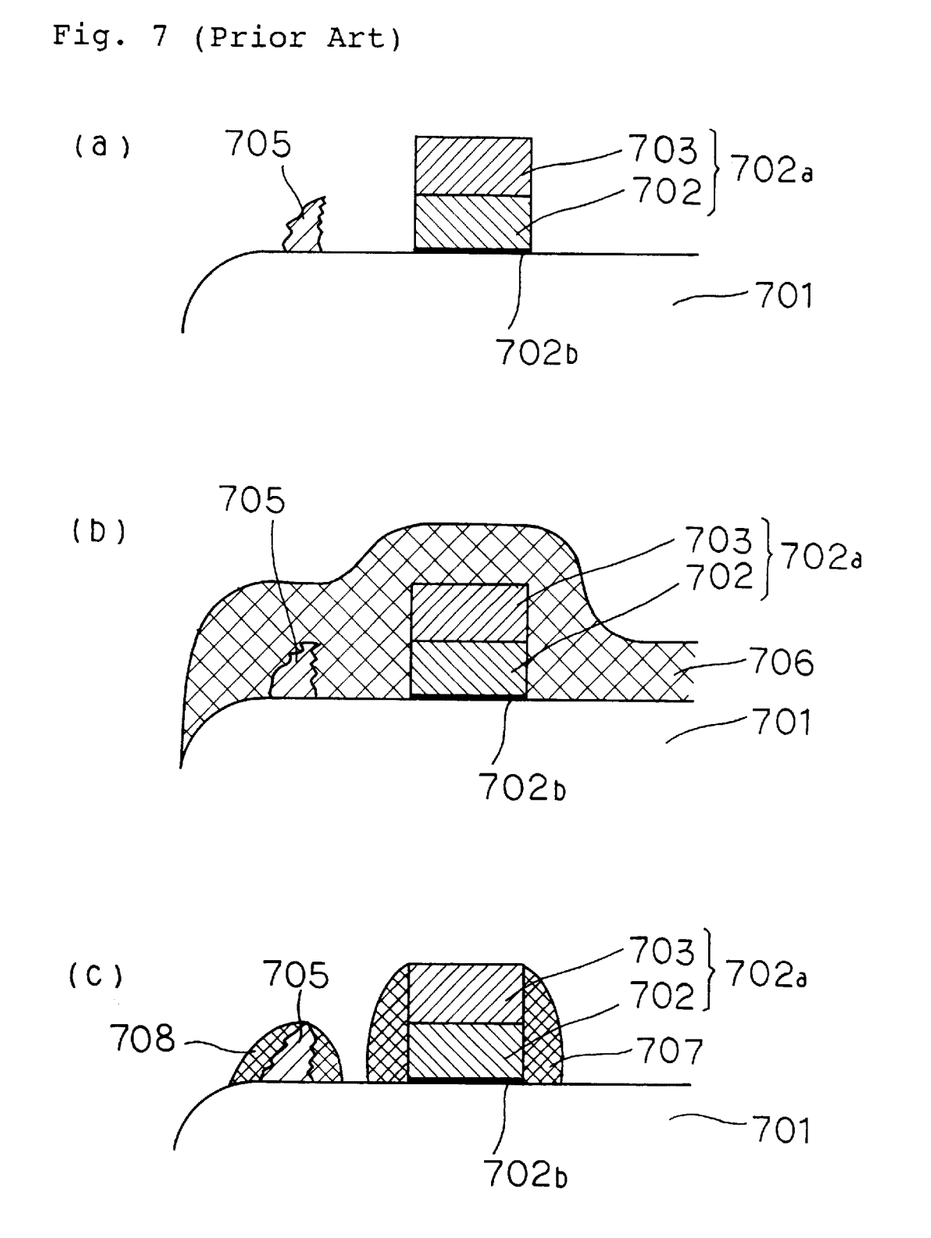
FIG. 7 is another series of schematic cross-sectional views illustrating further steps of the conventional manufacturing method of a semiconductor device.

FIG. 7 shows a sequence of the steps of forming a sidewall film around a gate electrode 702a which is made of the polycrystalline silicon film 702 and the silicide film 703. FIG. 7(a) depicts a state (corresponding to FIG. 4(e)) immediately after formation of the gate electrode 702a, and, herein, the remnant silicide 705 is not peeled off from the semiconductor substrate 701 but sill kept thereon.

FIG. 7(b) shows a state (corresponding to FIG. 5(f)) after deposition of an insulating film 705 for sidewall film formation, and, by etching the sidewall insulating film 706, a sidewall film 707 is formed, as shown in FIG. 7(c) (corresponding to FIG. 5(g)). Hereat, not only the sidewall film 707 on a lateral face of the gate electrode 702a but also a sidewall film 708 on a sidewall of the remnant silicide 705 are formed, and this sidewall film 708 as well as the remnant silicide 705 become waste matter and dust, when they are peeled off from the semiconductor substrate 701 in the subsequent steps.

Figure 8:
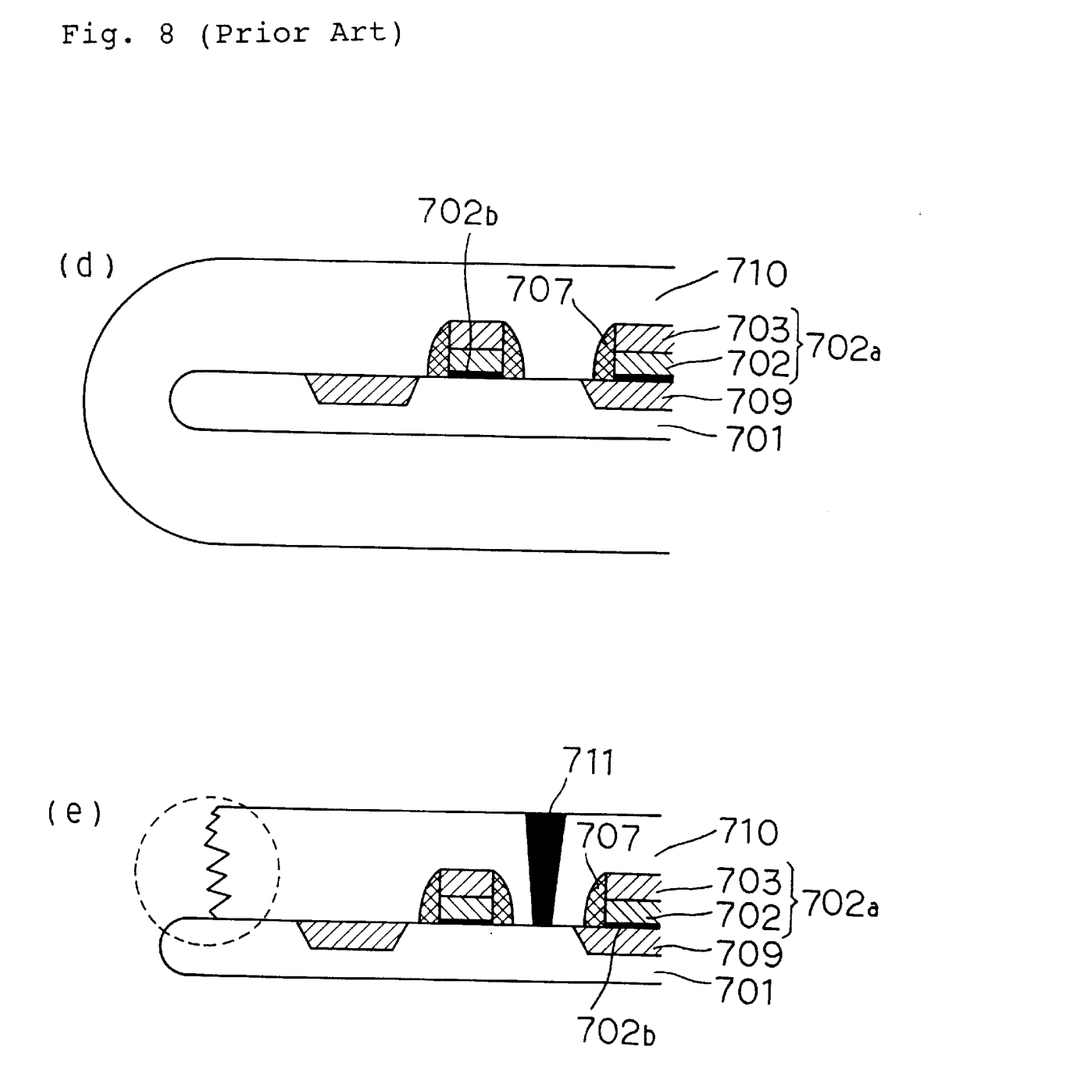
FIG. 8 is a series of schematic cross-sectional views illustrating further steps of the conventional manufacturing method of a semiconductor device.

After forming the sidewall film, source-drain regions and the likes which are omitted from the drawings are formed by the ion implantation method or such in regions where no element isolation region 709 is formed, as shown in FIG. 8(d), whereby an underlying transistor layer is accomplished. After that, an interlayer insulating film 710 is formed into a thickness of 900 nm or so through double-sided growth by the LP-CVD method. Only a backside film of the interlayer insulating film 710 is then removed by etching, and a contact plug 711 and the like are formed to obtain a structure shown in FIG. 8(e).

Figure 9:
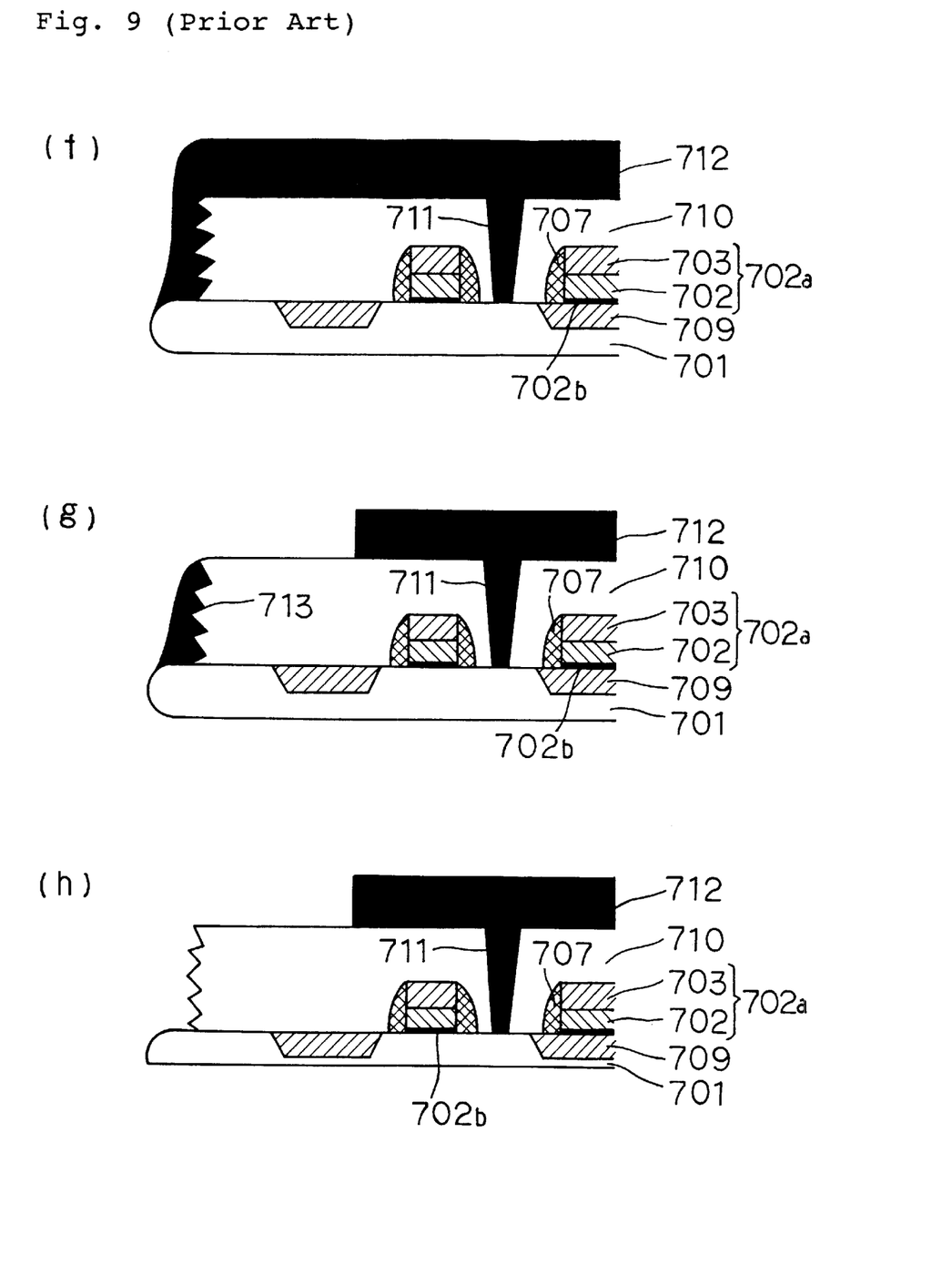
FIG. 9 is a series of schematic cross-sectional views illustrating further steps of the conventional manufacturing method of a semiconductor device.

Further, as shown in FIG. 9(f), a metal interconnection layer 712 is formed, and, by patterning this, a structure shown in FIG. 9(g) is obtained. However, when the backside film within the interlayer insulating film 710 which is formed through double-sided growth, as shown in FIG. 8(d), is removed, a peripheral section of the interlayer insulating film 710 on the obverse surface side is also, in part, removed on the edge section of the wafer, as shown encircled in FIG. 8(e). As a result, a stepped part having a sidewall is formed on the edge section of the interlayer insulating film 710. When a metal interconnection film 712 is formed in this state, as shown in FIG. 9(f), and then patterned, the metal interconnection film 712 cannot be etched sufficiently, owing to the presence of a sidewall on the edge section of the interlayer insulating film 710, and a remnant metal 713 is generated, as shown in FIG. 9(g). When peeled off, this remnant metal becomes waste matter and dust and, in some cases, even brings about a short-circuit between two points of the metal interconnection film 712.

After completing fabrication on the obverse surface of the semiconductor substrate, grinding is applied to the reverse surface of the semiconductor substrate 701, as shown in FIG. 9(h).

In effect, in such a conventional manufacturing method as described above, a polycrystalline silicon film, an insulating film to form a sidewall, an interlayer insulating film and the like are formed on the reverse surface side of the semiconductor substrate, and, unless these films are removed, the total film thickness on the reverse surface side amounts to 1.4 $\mu$m or so. Therefore, in order to fix the semiconductor substrate onto a CVD apparatus and a transportation vehicle sufficiently and prevent focus at exposure from shifting, these backside films are all removed, by means of etching or the like, before any step following the film formation proceeds.

The present invention was based on the understanding that waste matter and dust are generated by the mechanism described above, and developed by employing a method in which any backside film formed through double-sided growth is removed not in the middle of fabrication steps but when grinding is applied to the reverse surface of the semiconductor substrate. The present invention, being successfully completed, facilitates to reduce a large amount of waste matter and, in addition, simplify the steps of the manufacturing method considerably.

Now, referring to FIGS. 1–3, an example of the steps of a specific manufacturing method in accordance with the present invention is described in detail below.

Figure 1:
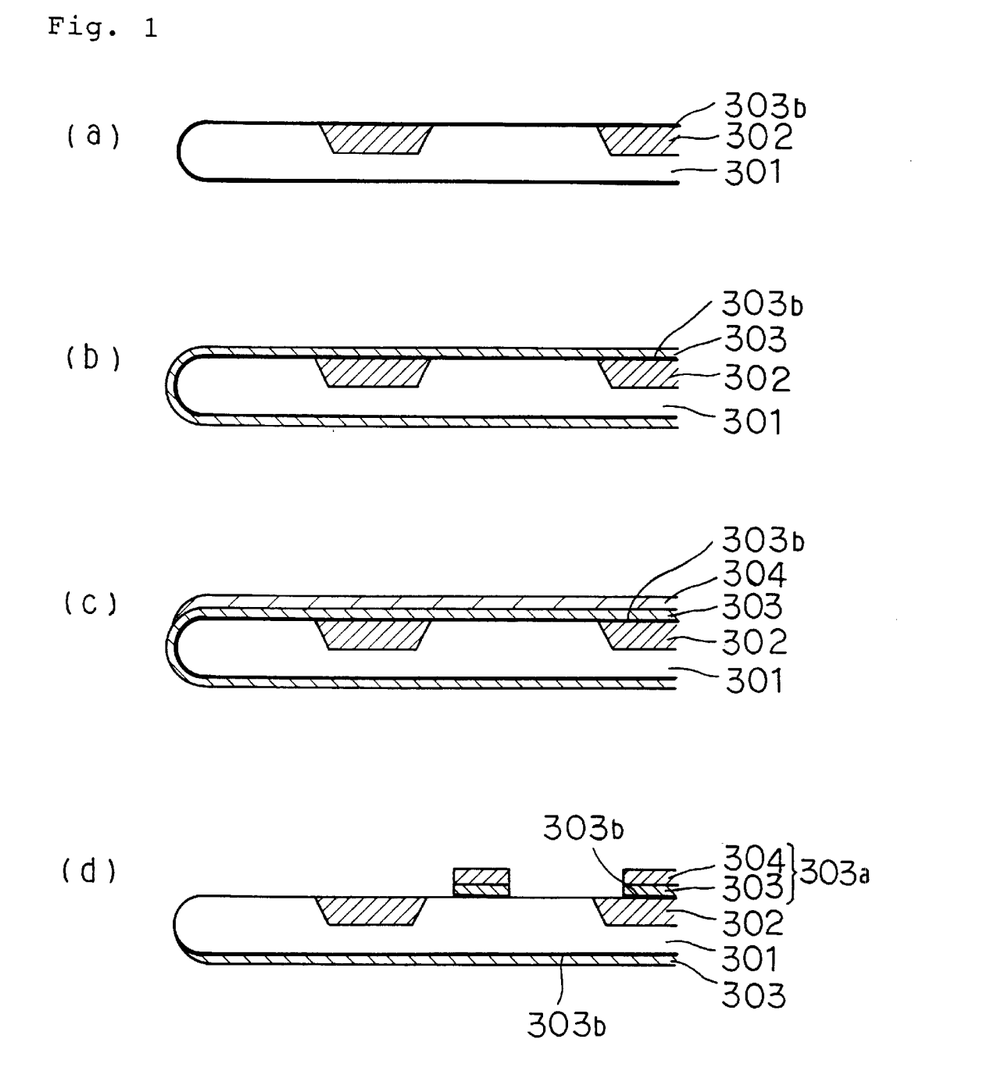
FIG. 1 is a series of schematic cross-sectional views illustrating the steps of a manufacturing method of a semiconductor device according to the present invention.

First, as shown in FIG. 1(a), trenches formed on a semiconductor substrate 301 are filled up with insulating material such as silicon dioxide, and thereby element isolation regions 302 are formed. After that, a gate oxide film 303b is grown.

Next, as shown in FIG. 1(b), a polycrystalline silicon film 303 to fabricate gate electrodes is grown as a first film on both of the obverse surface side and the reverse surface side of a semiconductor substrate 301. A backside film herein is not removed until the reverse surface of the semiconductor substrate is subjected to grinding.

The polycrystalline silicon film is generally formed through double-sided growth by the LP-CVD method to be preferably as thin as 150 nm or less. This can be explained from a fact that, if the polycrystalline silicon film is a thin film, the semiconductor substrate can be fixed well onto a CVD apparatus and a transportation vehicle in the subsequent steps without removing the backside film and, thus, a focus shift at the time of exposure can be suppressed. On the other hand, in order to fabricate gate electrodes with excellent operation capability, the film thickness of the polycrystalline silicon film should be set to be preferably not less than 50 nm and, for example, 100 nm or so.

When the gate electrodes are formed from polycide for the purpose of improving conductivity of the gate electrodes and such, a silicide film 304 is formed as a second film over the polycrystalline silicon film 303 only on the obverse surface side of the semiconductor substrate 301, as shown in FIG. 1(c). The silicide film is, in general, formed through single-sided growth by the sputtering method, and its film thickness is set to be preferably not less than 50 nm but not greater than 200 nm and more preferably not greater than 150 nm. With a film thickness of 50 nm or greater, the gate electrode obtained is capable to demonstrate excellent performance, while a film thickness of 200 nm or less can provide good productivity. Thus, the film thickness is set to be, for example, 100 nm or so.

As a silicide, hereat, tungsten silicide, titanium silicide, cobalt silicide, molybdenum silicide, tantalum silicide, platinum silicide or the like may be utilized.

The polycrystalline silicon film 303 and the silicide film 304 fabricated as described above are worked into gate electrodes 303a, as shown in FIG. 1(d). In this instance, such a residue as the residue 505 shown in FIG. 4(e) is not generated. The explanation lies in a fact that such an edge section as the one of the polycrystalline silicon film 503 having a sidewall shown in FIG. 4(d) cannot be formed because the polycrystalline silicon film 303 formed on the reverse surface side of the semiconductor substrate 301 has not been removed, and, consequently, no remnant silicide can be generated.

When a LDD (Lightly Doped Drain) structure, a self-align type contact plug and the like are required to be formed subsequently, sidewall films are formed on sidewalls of the gate electrodes. In this case, on both of the obverse surface side and the reverse surface side of the semiconductor substrate 301, a first insulating film 306 is formed from silicon dioxide or such to cover the gate electrodes 303a, as shown in FIG. 2(e). The first insulating film 306 formed on the obverse surface side of the semiconductor substrate is then etched to form sidewall films 306 on lateral faces of the gate electrodes 303a. As shown in FIG. 2(f), the first insulating film 306 formed on the reverse surface side of the semiconductor substrate hereat remains, and the first insulating film 306 is removed only when grinding is applied to the reverse surface of the semiconductor substrate 301.

The first insulating film to form sidewall films is generally formed through double-sided growth by the LP-CVD method to be preferably as thin as 200 nm or less. This results from a fact that, if the first insulating film is a thin film, the semiconductor substrate can be fixed well onto a CVD apparatus and a transportation vehicle in the subsequent steps without removing the backside film and, thus, a focus shift at the time of exposure can be suppressed. On the other hand, to make sidewall films function satisfactorily, the film thickness of the first insulating film is set to be preferably not less than 50 nm and, for example, 130 nm or so.

Figure 2:
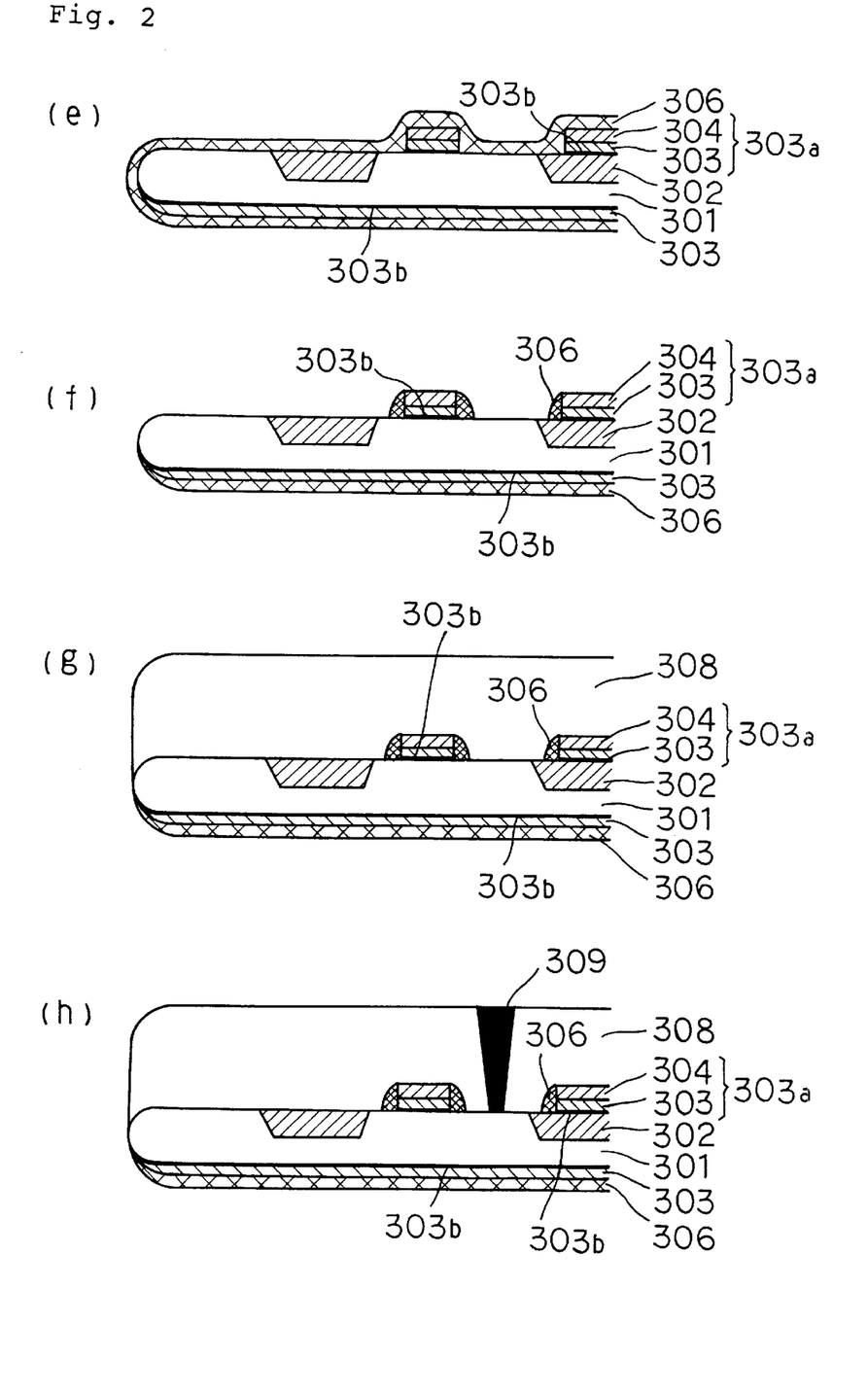
FIG. 2 is a series of schematic cross-sectional views illustrating further steps of the manufacturing method of a semiconductor device according to the present invention.

In the state after completing formation of the sidewall films 306, which is shown in FIG. 2(f), such a residue as the residue 507 shown in FIG. 5(g) cannot be generated because, in the absence of the remnant silicide on the obverse surface side of the semiconductor substrate 301, no superfluous sidewall film can be formed.

Subsequently, source-drain regions and the like which are omitted from the drawings are formed by the ion implantation method or such, whereby an underlying transistor layer is accomplished.

After that, as shown in FIG. 2(g), only on the obverse surface side of the semiconductor substrate 301, a second insulating film is formed as an interlayer insulating film 308 so as to cover gate electrodes 303a. The interlayer insulating film is formed from silicon dioxide or such through single-sided growth by the plasma CVD (P-CVD) method or, if circumstances require, the high density plasma CVD (HDP-CVD) method. The film thickness thereof is generally set to be not less than 500 nm but not greater than 1.5 $\mu$m and, for example, 900 nm or so.

In the case of FIG. 2(g), no interlayer insulating film is formed on the reverse surface side of the semiconductor substrate so that the semiconductor substrate can be fixed well onto a CVD apparatus and a transportation vehicle in the subsequent steps and, thus, a focus shift at the time of exposure can be suppressed.

At this stage, on the reverse surface side of the semiconductor substrate 301, there are polycrystalline silicon film 303 and the insulating film 306 for sidewall film formation, being formed. Viewed from the points of capability to provide such satisfactory fixation and good focus as described above, the total film thickness of these films is set to be preferably not greater than 350 nm and more preferably not greater than 300 nm. On the other hand, to secure performance of high quality for the semiconductor device that is to be obtained, the total film thickness is preferably not less than 100 nm and more preferably not less than 200 nm and, for example, 230 nm or so.

Figure 3:
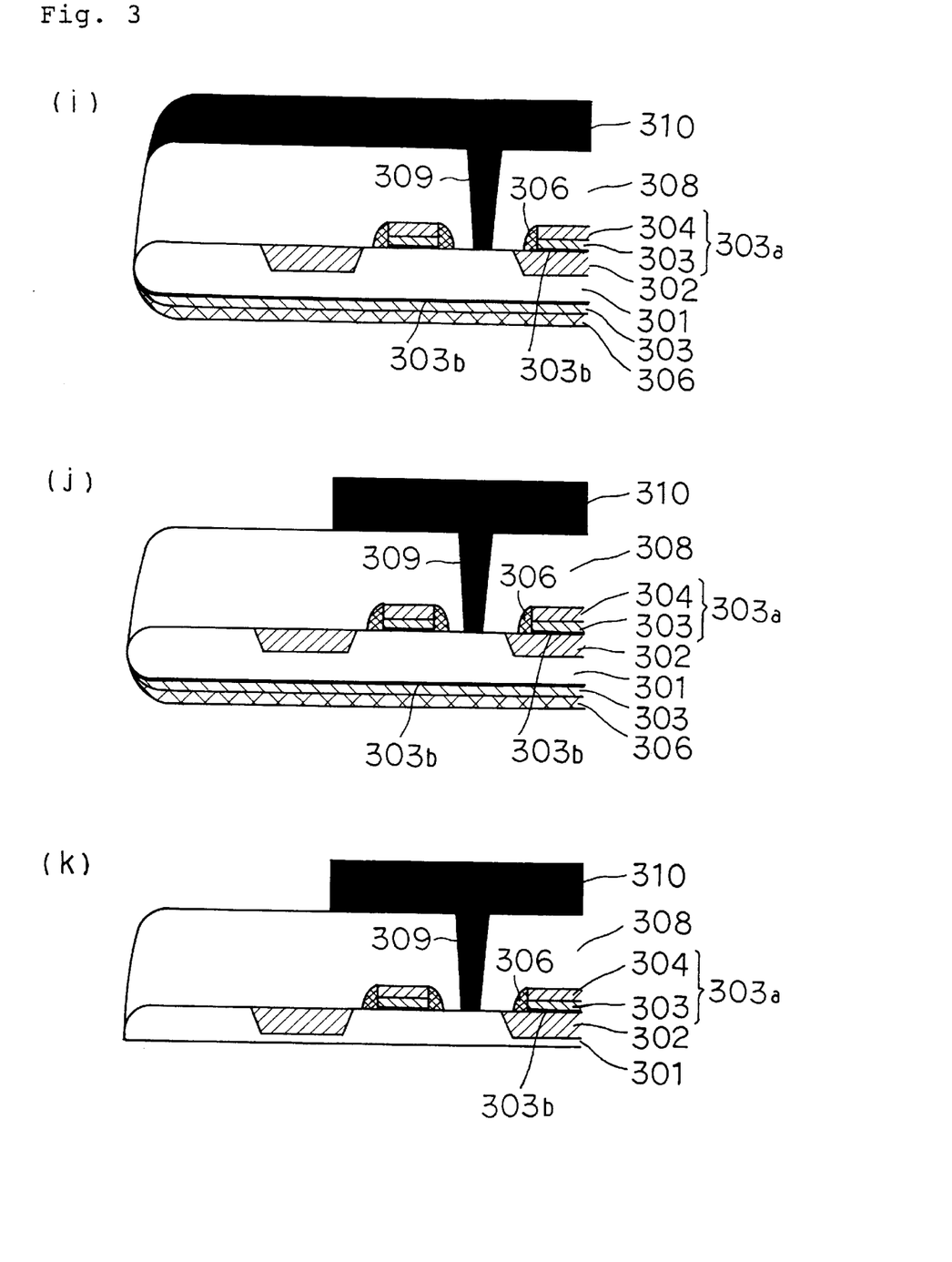
FIG. 3 is a series of schematic cross-sectional views illustrating further steps of the manufacturing method of a semiconductor device according to the present invention.

Subsequently, as shown in FIG. 2(h), a contact plug 309 is fabricated and, as shown in FIG. 3(i), a metal interconnection layer 310 is formed and then patterned, and thereby a structure shown in FIG. 3(j) is obtained. Hereat, the contact plug is generally fabricated from a material containing W such as tungsten, tungsten silicide or the like, while the metal interconnection layer is fabricated from an interconnection material whose main component is Al, an interconnection material whose main component is Cu, or the like.

In the case of FIG. 3(j), such a remnant metal as the remnant metal 713 shown in FIG. 9(g) cannot be generated, because the interlayer insulating film 308 is not formed on the reverse surface side of the semiconductor substrate 301 which makes removal of this film unnecessary and, thus, an edge section of the interlayer insulating film 710 having a sidewall as shown in FIG. 9(g) cannot be formed.

After that, an upper layer interconnection, an interlayer insulating film, a passivation film and the like, none of which are shown in the drawings are formed, whereby fabrication on the obverse surface side of the semiconductor substrate is completed. The semiconductor substrate 301 is set to have a thickness of 800 $\mu$m or so for the sake of protection against deformation and damage during fabrication. After completion of fabrication on the obverse surface side, the reverse surface of the semiconductor substrate is subjected to grinding, and the substrate is made thin to have a thickness of 200 $\mu$m–300 $\mu$m or so. Hereat, as shown in FIG. 3(k), the polycrystalline silicon film 303 as well as the insulating film 306 formed on the reverse surface side are removed. Especially in the case that a plurality of films are formed on the reverse surface side, it is preferable that none of the backside films are removed until fabrication on the obverse surface side is completed, and all of them are removed together when grinding is applied to the reverse surface of the semiconductor substrate, because, in this way, the amount of waste matter can be reduced and productivity, improved.

The semiconductor substrate obtained above is subjected to dicing and the obtained chips are each mounted onto a frame.

The method described above can be applied to any semiconductor device manufactured by a method comprising the step of double-sided growth of a thin film.

What is claimed is:

1. A method of manufacturing a semiconductor device, which comprises the steps of:
   forming a first film on both of an obverse surface side and a reverse surface side of a semiconductor substrate;
   forming only on the obverse surface side of said semiconductor substrate, a second film over said first film; and
   removing, by means of grinding, said first film formed on the reverse surface side of said semiconductor substrate as well as a part of said semiconductor substrate in depth from the reverse surface.

2. A method of manufacturing a semiconductor device according to claim 1, wherein a thickness of said first film is not less than 50 nm but not greater than 150 nm.

3. A method of manufacturing a semiconductor device according to claim 1, wherein:
   said first film is a polycrystalline silicon film; and
   said second film is a silicide film;
   which further comprises the step of working said polycrystalline silicon film and said silicide film into shape and thereby forming a gate electrode.

4. A method of manufacturing a semiconductor device according to claim 3, which further comprises the steps of:
   forming, on both of the obverse surface side and the reverse surface side of said semiconductor substrate, a first insulating film to cover said gate electrode; and
   etching said first insulating film formed on the obverse surface side of said semiconductor substrate and thereby forming a sidewall film on a lateral face of said gate electrode;
   wherein said first insulating film formed on the reverse surface side of said semiconductor substrate is removed in said step of grinding removal.

5. A method of manufacturing a semiconductor device according to claim 4, wherein a thickness of said first insulating film is not less than 50 nm but not greater than 200 nm.

6. A method of manufacturing a semiconductor device according to claim 5, wherein a total thickness of said first film and said first insulating film is not less than 100 nm but not greater than 350 nm.

7. A method of manufacturing a semiconductor device according to claim 3, which further comprises the step of forming, only on the obverse surface side of said semiconductor substrate, a second insulating film to cover said gate electrode.

8. A method of manufacturing a semiconductor device according to claim 7, wherein said second insulating film is an interlayer insulating film and a thickness thereof is not less than 500 nm but not greater than 1.5 $\mu$m.

9. A method of manufacturing a semiconductor device; which comprises the steps of:
   forming a polycrystalline silicon film into a thickness of not less than 50 nm but not greater than 150 nm on both of an obverse surface side and a reverse surface side of a semiconductor substrate;
   forming, only on the obverse surface side of said semiconductor substrate, a silicide film into a thickness of not less than 50 nm but not greater than 200 nm over said polycrystalline silicon film;
   working said polycrystalline silicon film and said silicide film into shape and thereby forming a gate electrode;
   forming, on both of the obverse surface side and the reverse surface side of said semiconductor substrate, an insulating film for sidewall formation into a thickness of not less than 50 nm but not greater than 200 nm to cover said gate electrode;
   etching said insulating film for sidewall formation which is formed on the obverse surface side of said semiconductor substrate and thereby forming a sidewall film on a lateral face of said gate electrode;
   forming, only on the obverse surface side of said semiconductor substrate, an interlayer insulating film into a thickness of not less than 500 nm but not greater than 1.5 $\mu$m to cover said gate electrode; and
   removing, by means of grinding, said polycrystalline silicon film and said insulating film for sidewall formation, both of which are formed on the reverse surface side of said semiconductor substrate, as well as a part of said semiconductor substrate in depth from the reverse surface.

* * * * *